US008164391B2

(12) United States Patent  
Huynh

(10) Patent No.: US 8,164,391 B2  
(45) Date of Patent: Apr. 24, 2012

(54) SYNCHRONIZATION OF MULTIPLE HIGH FREQUENCY SWITCHING POWER CONVERTERS IN AN INTEGRATED CIRCUIT

(75) Inventor: Steven Huynh, Fremont, CA (US)

(73) Assignee: Active-Semi, Inc. (VG)

( * ) Notice: Subject to any disclaimer, the term of this patent is extended or adjusted under 35 U.S.C. 154(b) by 47 days.

(21) Appl. No.: 12/804,754

(22) Filed: Jul. 28, 2010

(65) Prior Publication Data

US 2012/0025919 A1 Feb. 2, 2012

(51) Int. Cl.
G05F 1/40 (2006.01)
H02J 1/12 (2006.01)
H02M 3/156 (2006.01)
H03L 7/00 (2006.01)

(52) U.S. Cl. ............ 331/34; 307/82; 323/282; 323/284; 323/351; 363/97; 363/131

(58) Field of Classification Search ..................... 331/34; 307/82; 323/207, 271, 282, 284, 285, 351; 363/97, 131
See application file for complete search history.

(56) References Cited

U.S. PATENT DOCUMENTS

| 5,959,478 | A * | 9/1999 | Ciccone et al. | 327/157 |
|---|---|---|---|---|
| 6,693,409 | B2 | 2/2004 | Lynch et al. | 323/208 |
| 6,801,028 | B2 | 10/2004 | Kernahan et al. | 323/283 |
| 6,819,011 | B2 | 11/2004 | Kernahan et al. | 307/35 |
| 6,825,644 | B2 | 11/2004 | Kernahan et al. | 323/283 |
| 6,841,983 | B2 | 1/2005 | Thomas | 323/322 |
| 6,894,463 | B2 | 5/2005 | Kernahan | 323/267 |
| 6,906,500 | B2 | 6/2005 | Kernahan | 323/225 |
| 6,909,266 | B2 | 6/2005 | Kernahan et al. | 323/282 |
| 6,917,188 | B2 | 7/2005 | Kernahan | 323/282 |
| 6,946,753 | B2 | 9/2005 | Kernahan et al. | 307/151 |
| 6,975,525 | B2 | 12/2005 | Kernahan | 363/98 |
| 6,979,985 | B2 * | 12/2005 | Yoshida et al. | 323/282 |
| 6,979,987 | B2 | 12/2005 | Kernahan et al. | 323/283 |
| 7,002,328 | B2 | 2/2006 | Kernahan et al. | 323/283 |
| 7,019,506 | B2 | 3/2006 | Kernahan | 323/284 |
| 7,092,265 | B2 | 8/2006 | Kernahan | 363/65 |
| 7,095,220 | B2 | 8/2006 | Kernahan | 323/300 |
| 7,279,875 | B2 * | 10/2007 | Gan et al. | 323/282 |
| 7,365,661 | B2 | 4/2008 | Thomas | 341/117 |
| 7,522,431 | B2 * | 4/2009 | Huynh et al. | 363/21.12 |
| 7,876,081 | B2 * | 1/2011 | Hachiya et al. | 323/284 |
| 2004/0145357 | A1 | 7/2004 | Lynch et al. | 323/208 |
| 2007/0040657 | A1 | 2/2007 | Fosler et al. | 340/333 |
| 2007/0262823 | A1 | 11/2007 | Cohen et al. | 331/45 |
| 2008/0086710 | A1 * | 4/2008 | Huynh et al. | 716/11 |
| 2009/0013199 | A1 | 1/2009 | Leung et al. | 713/300 |
| 2009/0027019 | A1 | 1/2009 | Dowlatabadi | 323/282 |
| 2011/0080755 | A1 * | 4/2011 | Huang et al. | 363/13 |

* cited by examiner

Primary Examiner — Levi Gannon
(74) Attorney, Agent, or Firm — Imperium Patent Works; Darien K. Wallace

(57) ABSTRACT

A phase locked loop is used to synchronize the switching frequency of a high frequency switching power converter to a clock signal. A switching power converter integrated circuit is a tile-based power management unit and includes an oscillator and multiple tiles of switching power converters. The oscillator generates a clock signal having a clock frequency. A first switching power converter includes a switch and a phase locked loop and switches at a first frequency. The switch has a gate that receives a gate signal. The phase locked loop synchronizes the first frequency to a first integer multiple of the clock frequency. A second switching power converter switches at a second frequency that is a second integer multiple of the clock frequency. The first frequency is synchronized to a multiple of the clock frequency when a second edge of the gate signal coincides with a first edge of the clock signal.

21 Claims, 7 Drawing Sheets

US 8,164,391 B2

SYNCHRONIZATION OF MULTIPLE HIGH FREQUENCY SWITCHING POWER CONVERTERS IN AN INTEGRATED CIRCUIT

TECHNICAL FIELD

The present invention relates generally to the field of power conversion integrated circuits (ICs). More particularly the invention relates to the synchronization of power converters.

BACKGROUND

With the fast growth of portable electronics and equipment, the demand for power converters that are lower in cost, higher in efficiency, and smaller in size is increasing. A high switching frequency is often the result of using smaller components to meet these demands. Synchronizing multiple power converters operating at increasingly higher switching frequencies presents challenges, especially in integrated circuit applications having multiple power converters.

A conventional DC-DC converter capable of reaching limited switching frequency operation is shown in FIG. 1 (prior art). In this circuit, DC-DC converter IC 10 regulates an output voltage via a resistive feedback divider 11 made up of resistors 12 and 13 between the output voltage and a ground node GND. A center tap of resistive divider 11 is connected to a feedback amplifier 14 that amplifies the difference between a feedback signal 15 and a reference voltage from a voltage reference circuit 16. The signal at the output of feedback amplifier 14 is then converted into a duty-cycle signal 17 by a controller 18 that bases the switching frequency on an oscillator 19. Duty-cycle signal 17 then drives a main switch 20 and a synchronous rectifier 21, generating a voltage pulse waveform at an inductor switching node (LX) 22. An inductor 23 and an output capacitor 24 act as a low pass filter to filter out the voltage pulse waveform to supply an output voltage onto the output voltage node 25. Because of the negative feedback effect, the output voltage is regulated so that the feedback voltage is essentially equal to the reference voltage. Unfortunately, delays in feedback amplifier 14 and controller 18 both act to limit the switching frequency of converter IC 10.

FIG. 2 (prior art) shows an example of another prior art DC-DC converter IC 30 capable of higher frequency operation than the circuit shown in FIG. 1. In this architecture, a feedback resistor 31 and a second resistor 32 are connected in series between an inductor switching node (LX) 33 and a feedback node (FB) 34 to provide a DC feedback path. In addition, a feed-forward capacitor 35 is connected in parallel with resistor 32 between feedback node (FB) 34 and a hysteretic feedback comparator 36 to provide a high frequency feedback path. Feedback node (FB) 34 is also connected to an output voltage node 37. An inductor 38 is connected between inductor switching node (LX) 33 and output voltage node 37. Hysteretic feedback comparator 36 compares a feedback voltage 39 to a reference voltage from a voltage reference circuit 40 and generates a signal to control a main switch 41 and a synchronous rectifier 42 via a controller 43. In this circuit, the switching frequency is a function of feedback resistor 31, feed-forward capacitor 35, an hysteresis voltage output by feedback comparator 36, the input voltage 44, and the output voltage on output voltage node 37. Converter IC 30 can achieve higher frequency operation than converter IC 10 because it is easier to stabilize, the output voltage variation is forward-fed into feedback node (FB) 34, and there is less delay in the loop. Converter IC 30 is a free-running, hysteretic DC-DC converter that is not synchronized with any external clock.

Power converters such as converter IC 30 are often referred to as hysteretic converters because they employ a hysteretic comparator. Power converters such as converter IC 10 are often referred to as clock-based because they include a clock, such as oscillator 19 illustrated in FIG. 1.

In many applications, multiple switching power converters are synchronized to minimize interference and noise. However, it is often difficult to synchronize multiple power converters operating at high switching frequencies, such as power converters that are not clock-based. As hand-held and/or portable devices continue to decrease in physical size, there is a need to reduce inductor and capacitor component sizes by increasing the switching frequency of the converters in power management unit (PMU) integrated circuits. In these power management applications, multiple switching power converters within a single integrated circuit require both high switching frequency and synchronized switching. In view of the foregoing, there is a need for a solution to synchronize multiple switching power converters operating at high switching frequencies in an integrated circuit.

SUMMARY

A phase locked loop is used to synchronize the switching frequency of a high frequency switching power converter to a master clock signal. A switching power converter integrated circuit is a tile-based power management unit and includes an oscillator and multiple tiles of switching power converters. The oscillator generates a clock signal having a clock frequency. A first switching power converter that includes a phase locked loop circuit switches at a first frequency. The phase locked loop circuit synchronizes the first frequency to a first integer multiple of the clock frequency. A second switching power converter switches at a second frequency that is a second integer multiple of the clock frequency. The second integer multiple can equal the first integer multiple.

The first switching power converter has a main switch with a gate that receives a gate signal. The gate signal has a second edge. The first frequency is synchronized to a first integer multiple of a clock frequency when the second edge (either falling or rising edge) of the gate signal coincides with a first edge (either falling edge or rising edge) of the clock signal.

A method of synchronizing the switching frequencies of high-frequency switching power converters to the frequency of a master clock signal involves receiving an external clock signal onto a phase locked loop of a converter integrated circuit. The converter integrated circuit is a tile-based power management unit. The method includes receiving a gate signal onto the phase locked loop. The gate signal is also received onto a gate of a main switch of one of the switching power converters of the integrated circuit. The method also includes generating a filter signal that is used to synchronize the gate signal to the external clock signal. The filter signal is generated by the phase locked loop. The gate signal has a second edge. The gate signal is synchronized to the external clock signal when the second edge (either falling edge or rising edge) of the gate signal coincides with a first edge (either falling edge or rising edge) of the clock signal. In one embodiment, the switching power converter integrated circuit does not include an oscillator that determines the switching frequency of the switching power converter.

The method also includes receiving a second gate signal onto a second gate of a second main switch of another one of the switching power converters of the integrated circuit. The filter signal is also used to synchronize the second gate signal to the external clock signal. Where the external clock signal has a frequency F, the gate signal has a frequency n*F, and the second gate signal has a frequency m*F. The values n and m are integers between one and twenty, and n and m can be the same integer value or different integer values.

In another embodiment, an integrated circuit includes an oscillator and first and second switching power converters. The oscillator generates a clock signal. The first switching power converter includes a main switch and means for synchronizing the first switching power converter to the clock signal. The main switch has a gate that is coupled to the means. The second switching power converter is also synchronized to the clock signal. A gate signal is present on the gate of the main switch, and gate signal has a second edge. The means synchronizes the second edge (either rising edge or falling edge) of the gate signal to coincide with a first edge (either rising edge or falling edge) of the clock signal. In one aspect, neither the first switching power converter nor the second switching power converter includes an oscillator that determines its own switching frequency.

Other embodiments and advantages are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings.

In one novel aspect, a phase locked loop is employed to synchronize the switching of an exemplary switching power converter tile to a master clock signal external to the tile. The switching of the exemplary switching power converter is not determined by a clock other than the master clock signal.

Figure 1:
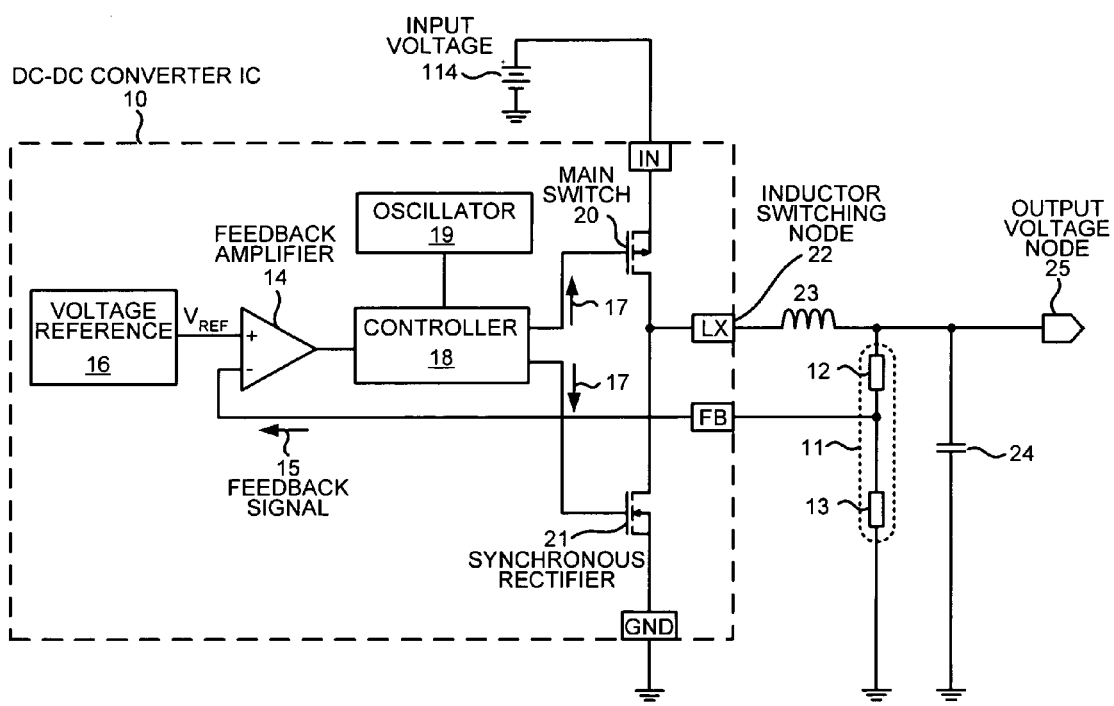
FIG. 1 (prior art) illustrates an example of a clock-based DC-DC converter.
Figure 2:
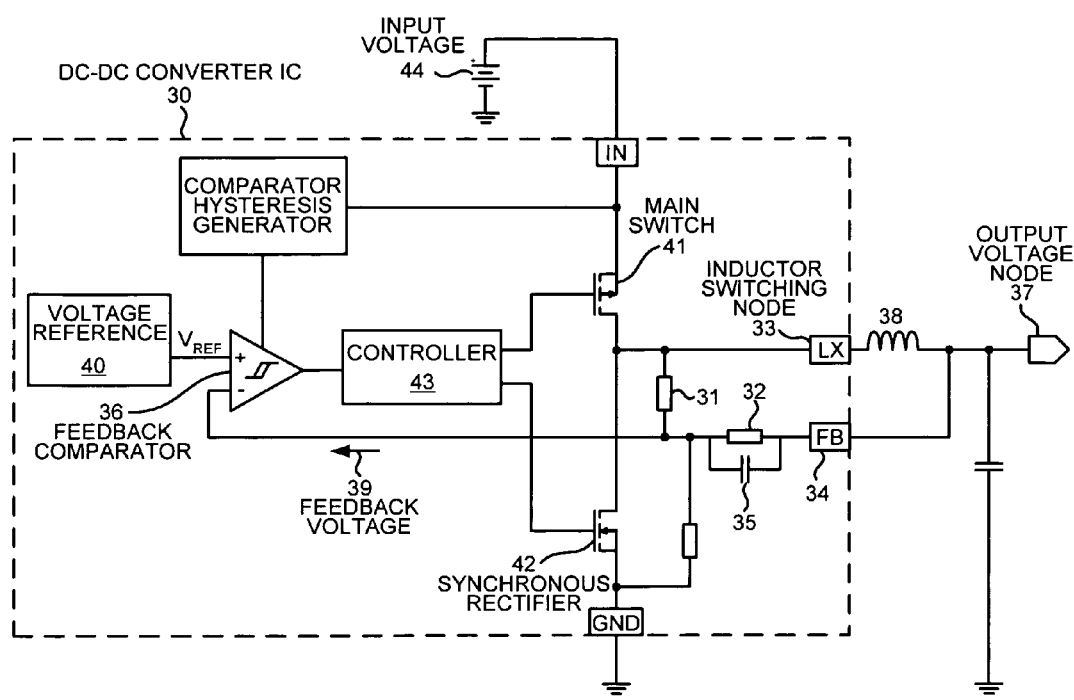
FIG. 2 (prior art) illustrates an example of a DC-DC converter employing a hysteretic comparator that results in higher frequency operation than the circuit shown in FIG. 1.
Figure 3:
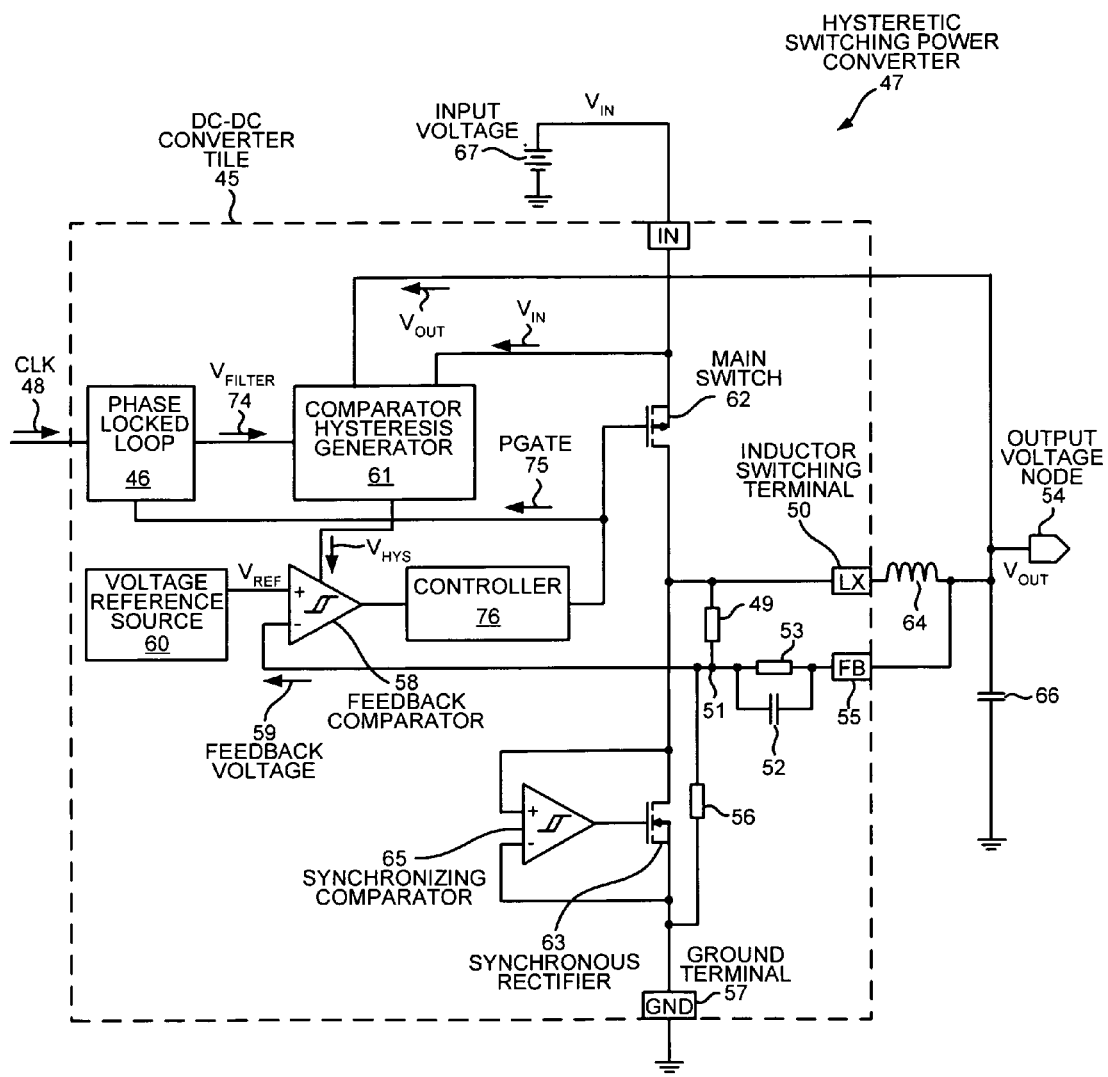
FIG. 3 illustrates an exemplary hysteretic DC-DC converter tile that employs a phase locked loop to synchronize the exemplary hysteretic DC-DC converter to a clock signal.

FIG. 3 shows an embodiment of a DC-DC converter tile 45 that includes a phase locked loop 46 and does not include an oscillator. Converter tile 45 is one of a plurality of tiles on a power management integrated circuit. Phase locked loop 46 synchronizes an exemplary hysteretic switching power converter 47 to an external clock signal (CLK) 48. Converter tile 45 includes a feedback resistor 49 connected between an inductor switching terminal (LX) 50 and a feedback node 51 to provide a DC feedback path. In addition, a feed-forward capacitor 52 and a resistor 53 are connected between feedback node 51 and an output voltage node 54. In this embodiment, feed-forward capacitor 52 and resistor 53 are connected between feedback node 51 and a feedback terminal (FB) 55. A resistor 56 is connected between feedback node 51 and a ground terminal (GND) 57. A hysteretic feedback comparator 58 compares a feedback voltage 59 present on feedback node 51 to a reference voltage $V_{REF}$ from a voltage reference source 60 and outputs a control signal.

If the feedback voltage 59 drops below the reference voltage $V_{REF}$, feedback comparator 58 signals an "ON" cycle. During the "ON" cycle, a hysteresis voltage $V_{HYS}$ from a comparator hysteresis generator 61 is added to the reference voltage $V_{REF}$ and used as the new threshold of feedback comparator 58. The "ON" cycle also turns on a main switch 62 to route an inductor current into the output voltage node 54, increasing the output voltage. When feedback voltage 59 exceeds the reference voltage $V_{REF}$ plus the hysteresis voltage $V_{HYS}$ and a minimum "on" time is exceeded, a signal will turn off main switch 62, and converter tile 45 enters an "OFF" cycle. A synchronous rectifier 63 will then turn on to "catch" the current of an inductor 64 until either main switch 62 turns on again, or the current of inductor 64 discharges to essentially zero. Synchronous rectifier 63 is also connected to a synchronizing comparator 65 in a conventional zero-drop diode configuration. Synchronizing comparator 65 compares the voltage of inductor switching terminal (LX) 50 to that of ground terminal (GND) 57, which essentially determines the direction of the current flow through synchronous rectifier 63. To help avoid discharging the output voltage to ground terminal (GND) 57, comparator 65 turns off synchronous rectifier 63 before the current changes direction from flowing from the ground terminal (GND) 57 to the switching terminal (LX) 50 to flowing from terminal LX to terminal GND. Inductor 64 and an output capacitor 66 act as a low pass filter to filter out the pulses of the voltage waveform and to supply an output voltage onto output voltage node 54.

In alternate embodiments, one or more of the resistors and/or the capacitor comprising the feedback network may or may not be integrated into the IC. For example, feed-forward capacitor 52 and a resistor 53 may be connected between feedback terminal (FB) 55 and output voltage node 54.

Feed-forward capacitor 52, resistor 49, the hysteresis of feedback comparator 58, and the switching duty cycle determine the switching frequency. An additional discussion of how the switching frequency is determined appears in U.S. Pat. No. 7,279,875, which is incorporated herein by reference. In the following formulas, the capacitance of feed-forward capacitor 52 is represented by $C_{52}$, and the resistances of resistors 49, 56 and 53 are represented as $R_{49}$, $R_{56}$ and $R_{53}$, respectively. Designating the input voltage from an input voltage source 67 as $V_{IN}$, the output voltage on output voltage node 54 as $V_{OUT}$, comparator hysteresis voltage as $V_{HYS}$, reference voltage as $V_{REF}$, and the "ON" cycle time and "OFF" cycle times as $T_{ON}$ and $T_{OFF}$, respectively, the switching frequency can be derived via the following procedure:

During the "ON" cycle, $$C_{52}*V_{HYS}/T_{ON}=(V_{IN}-V_{REF})/R_{49}+(V_{OUT}-V_{REF})/R_{53}-V_{REF}/R_{56} \qquad (1)$$

Moreover, $$V_{OUT}=V_{REF}*[1+R_{49}*R_{53}/(R_{49}+R_{53})/R_{56}] \qquad (2)$$

By combining equations (1) and (2), the on time ($T_{ON}$) is calculated as:

$$T_{ON}=C_{52}*V_{HYS}*R_{49}/(V_{IN}-V_{OUT}) \qquad (3)$$

Similarly, during the "OFF" cycle, the off time ($T_{OFF}$) is obtained as:

$$T_{OFF} = C_{52} * V_{HYS} * R_4 / V_{OUT} \quad (4)$$

Consequently, $$\text{Period} = T_{ON} + T_{OFF} = C_{52} * V_{HYS} * R_{49} * (1/(V_{IN} - V_{OUT}) + 1/V_{OUT}) \quad (5)$$

$$\text{Frequency} = 1/\text{Period} = V_{OUT}(1 - V_{OUT}/V_{IN}) / (C_{52} * V_{HYS} * R_{49}) \quad (6)$$

As can be seen from equation (6), the switching frequency can be made to be independent of the duty cycle variation if the hysteresis voltage is made proportional to $1 - V_{OUT}/V_{IN}$. Since in most applications, the accuracy requirement on the switching frequency is no more than +/−10% to +/−20%, a piece-wise curve-fitting approach can be used to approximate $1 - V_{OUT}/V_{IN}$.

Equation (6) also shows that the switching frequency is inversely proportional to $V_{HYS}$. Thus, the switching frequency can be adjusted by adjusting the $V_{HYS}$ value. A higher value for $V_{HYS}$ results in a lower switching frequency. In the present example, comparator hysteresis generator 61 generates $V_{HYS}$ values to synchronize the switching to an external clock signal and to make the switching frequency less sensitive to momentary duty cycle variation.

Figure 4:
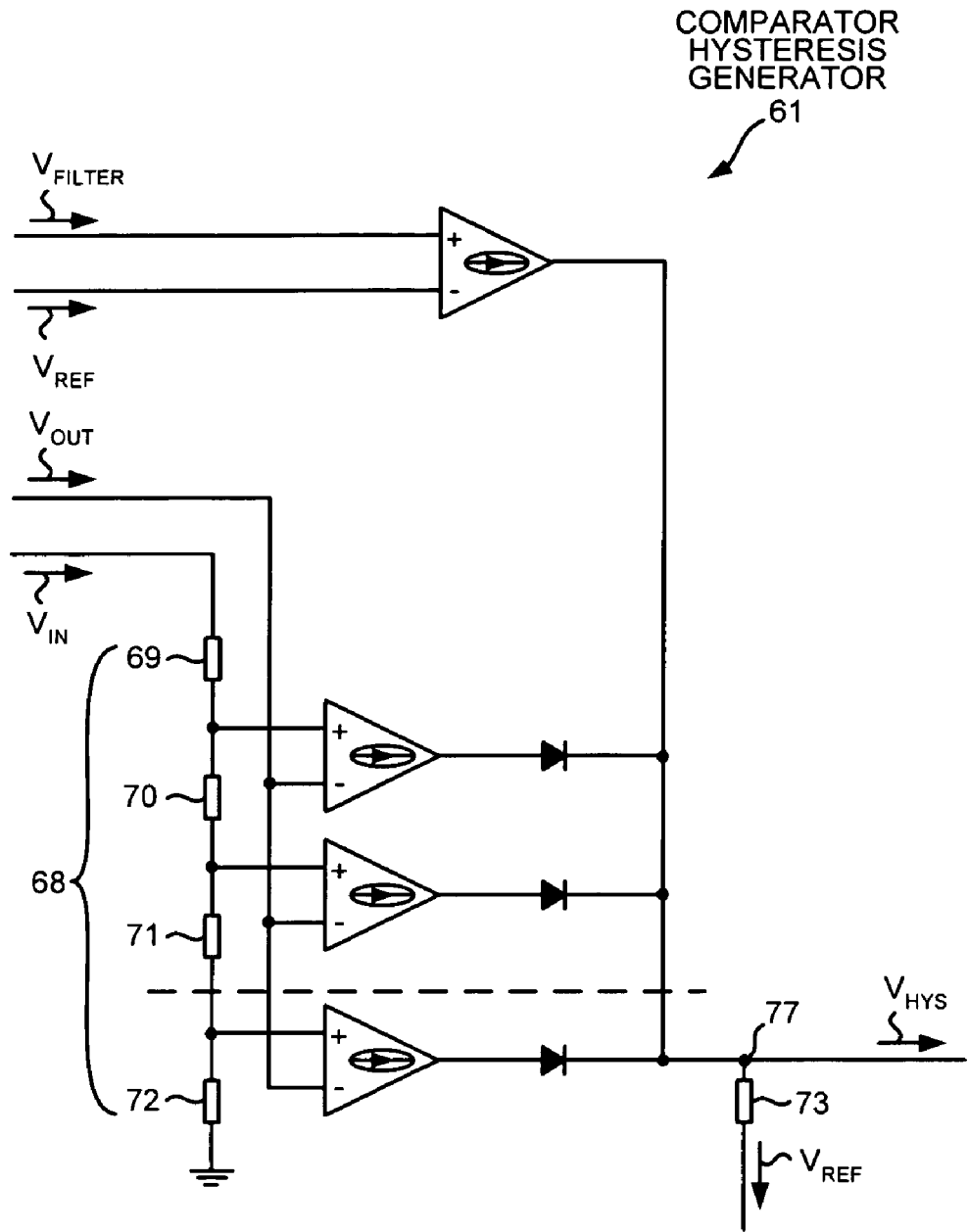
FIG. 4 illustrates a more detailed example of the comparator hysteresis generator of FIG. 3.

FIG. 4 shows comparator hysteresis generator 61 in more detail. Generator 61 generates the $V_{HYS}$ values in response to a filter signal $V_{FILTER}$ received from phase locked loop 46. Phase locked loop 46 generates a filter signal $V_{FILTER}$ 74 by detecting the time difference between a rising edge of external clock signal CLK 48 and a falling edge of a gate signal PGATE 75 generated by a controller 76.

Since the filter signal $V_{FILTER}$ has typically slow response time to variations, the comparator hysteresis generator 61 also includes the mechanism to keep the frequency less sensitive to momentary duty cycle variation. FIG. 4 also shows that comparator hysteresis generator 61 is used to achieve an adaptive hysteresis that is approximately proportional to $1 - V_{OUT}/V_{IN}$. Input voltage $V_{IN}$ is divided down by a voltage divider network 68 to different levels set by resistors 69, 70, 71, etc., relative to a base divider resistor 72. The error between each level and the output voltage $V_{OUT}$ is amplified and generates a current that, if positive, goes into a summing resistor 73 to generate the hysteresis voltage $V_{HYS}$ which is the output of hysteresis generator 61 in FIG. 3. For example, without limitation, to achieve +/−10% control on the frequency, approximately five levels can be used to generate $V_{HYS}$=20%, 40%, 60%, 80% and 100% of the maximum $V_{HYS}$ value between these levels. The maximum $V_{HYS}$ value can be between 10 mV and 30 mV for example in a typical embodiment. In alternate embodiments, more levels or fewer levels or resistors may be used to create a variety of hysteresis voltages.

Figure 5:
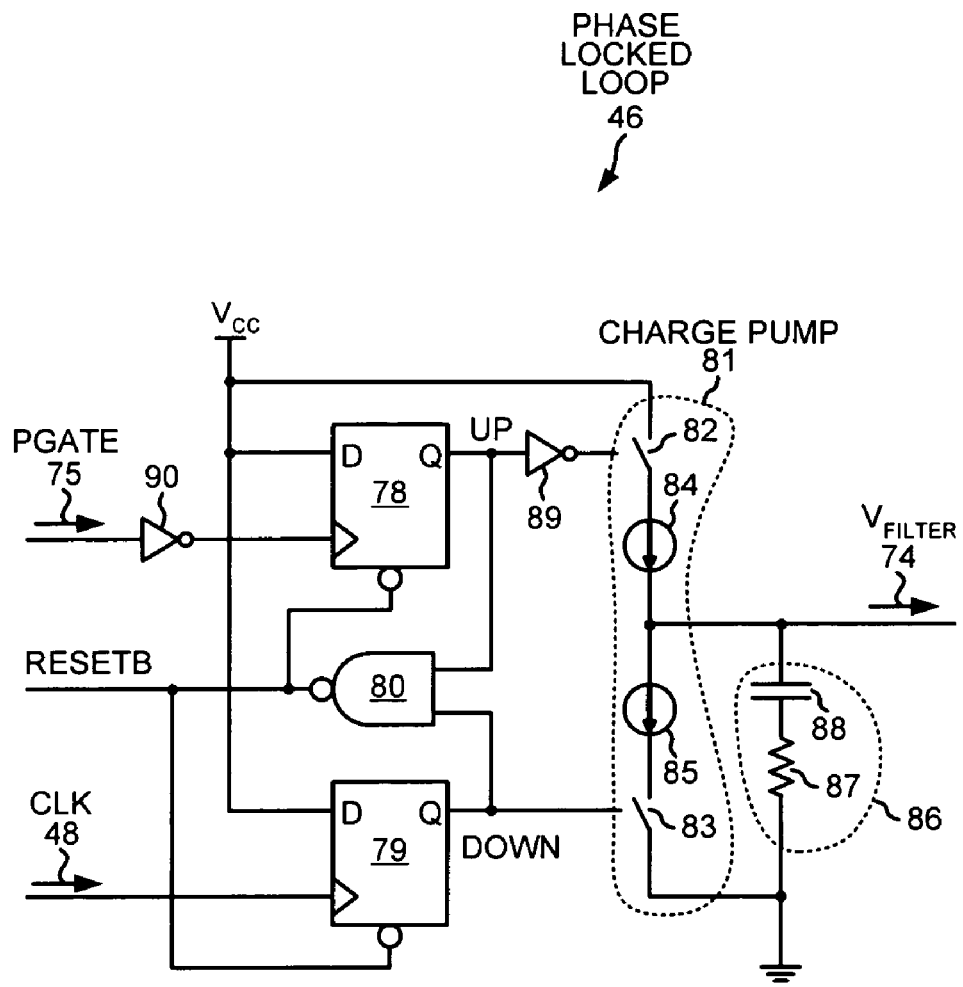
FIG. 5 illustrates a more detailed example of the phase locked loop of FIG. 3.

FIG. 5 shows phase locked loop 46 in more detail. Phase locked loop 46 is implemented as a charge pump. If the falling edge of gate signal PGATE 75 precedes the rising edge of CLK signal 48, an UP pulse is generated that increases the voltage of filter signal $V_{FILTER}$ 74. If the falling edge of gate signal PGATE 7.5 lags the rising edge of CLK signal 48, a DOWN pulse is generated that reduces the voltage of filter signal $V_{FILTER}$ 74. If the falling edge of gate signal PGATE 75 coincides with the rising edge of CLK signal 48, then filter signal $V_{FILTER}$ 74 is unchanged. Phase locked loop 46 includes two D-flip-flops 78 and 79 and a NAND gate 80. A charge pump 81 includes two switches 82 and 83 and two current sources 84 and 85. Loop filter 86 includes a resistor 87 and a capacitor 88 that generate the filter signal $V_{FILTER}$ 74.

FIG. 4 shows one embodiment by which filter signal $V_{FILTER}$ 74 controls the hysteresis voltage $V_{HYS}$. As the voltage of filter signal $V_{FILTER}$ 74 rises, a positive current is generated into the HYS node 77 and increases the hysteresis voltage $V_{HYS}$, thus reducing switching frequency according to equation (6). As the voltage of filter signal $V_{FILTER}$ 74 decreases, a negative current is generated that reduces the hysteresis voltage $V_{HYS}$, thus increasing switching frequency according to equation (6). So when the falling edge of gate signal PGATE 75 coincides with the rising edge of CLK signal 48, then hysteresis voltage $V_{HYS}$ stabilizes, and the frequency stops changing as a result of the action of phase locked loop 46. At this stable point, the start of the switching converter on-time is synchronized to the rising edge of external clock signal CLK 48, which can be at a different frequency.

Figure 6:
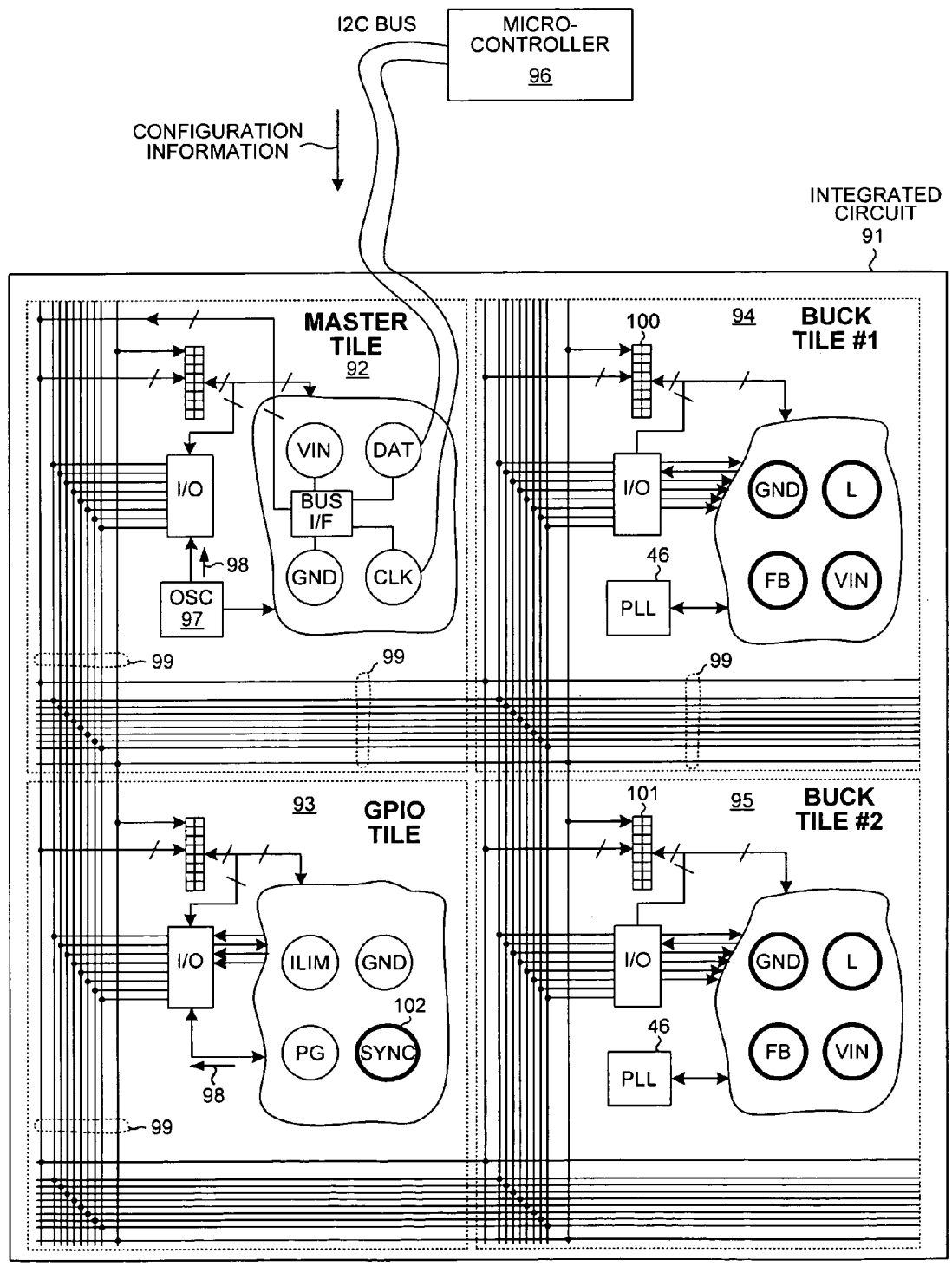
FIG. 6 illustrates an example of a tiled power management unit (PMU) implementation, including a phase locked loop that synchronizes tiled circuits with a master clock signal.

FIG. 6 shows another embodiment in which multiple switching converters of a tile-based power management unit (PMU) are synchronized to a master system clock. FIG. 6 shows a tile-based PMU IC 91. PMU IC 91 includes a master tile 92, a general purpose GPIO tile 93 and multiple buck tiles 94 and 95. PMU IC 91 is programmable with configuration information from a microcontroller 96. Master tile 92 includes an oscillator 97 that provides a master clock signal MCLK 98 throughout PMU IC 91. Buck tile 94 and buck tile 95 both accept MCLK signal 98 from the interconnection bus 99. The buck tiles 94 and 95 each have a phase locked loop circuit 46 to lock each buck tile's switching frequency to be a multiple of the MCLK frequency. Each buck tile can be locked to either the rising edge or the falling edge of MCLK.

In another example, MCLK signal 98 has a clock frequency of 2 MHz, while the switching frequency of buck tile 94 is locked to n*2 MHz, where n can be an integer between 1 and 20. The switching frequency of buck tile 95 is locked to m*2 MHz, where m can be an integer between 1 and 20. The integers n and m can be different values or the same value depending on the power management application. In another embodiment, the integers n and m can be programmed in registers 100 and 101 that can be volatile or non volatile.

In yet another embodiment, a SYNC terminal 102 on GPIO tile 93 can be configured to communicate the MCLK signal 98 onto PMU IC 91. In this manner, an external source outside of the IC can supply master clock signal MCLK 98, and the buck tiles 94-95 can be synchronized to the MCLK signal communicated over the SYNC terminal 102 in different multiples.

In yet another embodiment, the PMU IC 91 contains any multiple of buck tiles, GPIO tiles, and additional switching converter tiles. Any switching converter tile can use a higher multiple switching frequency based on the MCLK frequency by phase-locked synchronization.

Figure 7:
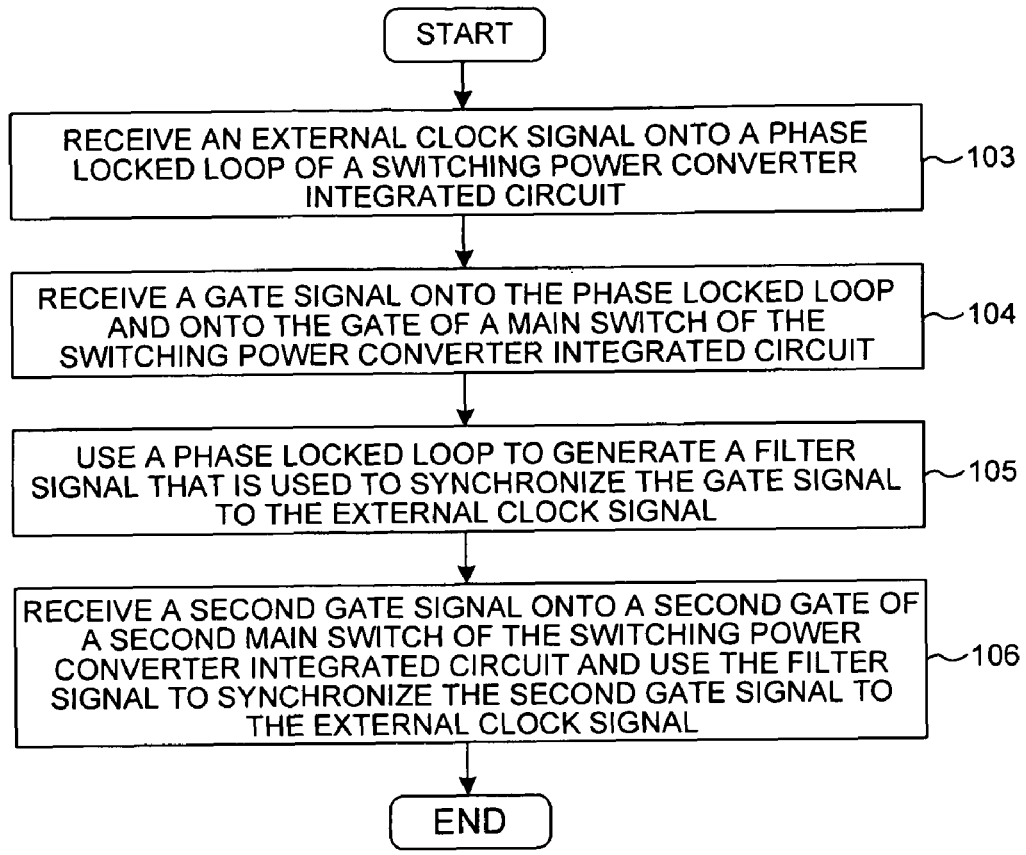
FIG. 7 is a flowchart of a method that uses a phase locked loop to synchronize the switching frequencies of switching power converters to the frequency of a master clock signal.

FIG. 7 is a flowchart illustrating steps 103-106 of a method of operation of PMU IC 91 of FIG. 6. The method synchronizes the switching frequencies of high-frequency switching power converters, such as buck tiles 94-95, to the frequency of a master clock signal that is generated external to the switching power converters.

In a first step 103, an external clock signal is received onto a phase locked loop of a converter in an integrated circuit. The converter integrated circuit is a tile-based power management unit. The integrated circuit is made up of a plurality of tiles. For example, the master clock signal is received onto phase locked loop 46 of buck tile 94.

In a step 104, gate signal PGATE 75 is received onto phase locked loop 46 of buck tile 94. The gate signal is also received onto a gate of a main switch of one of the switching power converters of the integrated circuit. For example, gate signal PGATE 75 is also received onto the gate of main switch 6 of buck tile 94.

In a step 105, the phase locked loop is used to generate a filter signal that is used to synchronize the gate signal to the external clock signal. For example, filter signal 74 is first used by comparator hysteresis generator 61 to generate a hysteresis voltage $V_{HYS}$, which is then used by feedback comparator 58 and controller 76 to generate gate signal PGATE 75. Phase locked loop 46 on buck tile 94 receives gate signal PGATE 75 and external clock signal CLK 48 and outputs filter signal 74 such that gate signal PGATE 75 is synchronized to external clock signal CLK 48. Main switch 62 turns on at a falling edge of the gate signal. The gate signal is synchronized to the external clock signal when the falling edge of the gate signal coincides with a rising edge of the clock signal. In one embodiment, the switching power converter integrated circuit does not include an oscillator. For example, buck tile 94 does not include an oscillator.

In a step 106, a second gate signal is received onto a second gate of a second main switch of another one of the switching power converters of the integrated circuit. For example, a gate signal is received onto a gate of a main switch on buck tile 95. A phase locked loop 46 on buck tile 95 generates a filter signal that is used to synchronize the second gate signal to the external clock signal. Where the external clock signal has a frequency F, the gate signal on buck tile 94 has a frequency n*F, and the second gate signal on buck tile 95 has a frequency m*F. The values n and m are integers between one and ten, and n and m can be the same integer value or different integer values. Consequently, the switching frequencies of the high-frequency switching power converters 94-95 are synchronized to the master clock signal.

Depending upon the needs of the particular application, those skilled in the art will readily recognize, in light of the teachings of the present invention, a multiplicity of alternate and suitable ways to implement high frequency switching converters besides hysteretic switching converters. Hysteretic dc-dc conversion is just one way of achieving high frequency switching in a power converter. Whatever way is used to achieve high frequency switching, the synchronization method described herein can be used to synchronize the high frequency switching to an external clock signal. In addition, there are also a multiplicity of alternate and suitable ways to implement the adaptive hysteresis. By way of example, and not limitation, instead of the proportional hysteresis adaptive scheme described above, other suitable linear or nonlinear functions may instead be implemented. Similarly, the resistor divider levels need not be linearly spaced if a non-uniform hysteresis response is desired. Also, difference voltage (Vout−Vin) amplifiers are shown conceptually as operational amplifiers, but any suitable electronics may be implemented. For example, without limitation, a proportional hysteresis voltage $V_{HYS}$ may be generated using a single simple linear amplifier (e.g., an operational amplifier), albeit at the cost of having the control of the levels for frequency control granularity. While a simple amplifier that converts difference voltage (Vout−Vin) to the hysteresis voltage can be implemented, not all the applications provide the required Vout information to the IC directly. In the case of external feedback control, only the resistor divided version of Vout is available to converter tile 45 through feedback terminal (FB) 55. Therefore, one can indirectly sense (Vout−Vin) by, for instance, sensing the slope of the inductor current during turn on (L*dI/dt=Vin−Vout), or by averaging voltage at inductor switching terminal (LX) 50 to obtain Vout because the average voltage at terminal LX is essentially Vout. In such cases, for example, the difference voltage (Vout−Vin) can easily be obtained using an operational amplifier.

In alternate embodiments of the present invention, the hysteresis correction means may be based on a look up table approach instead of the analog techniques described. In alternate embodiments, a phase locked loop may be employed to synchronize any switching converter that is not clock-based with a system clock at a frequency that is the same or lower than the clock frequency.

Although the present invention has been described in connection with certain specific embodiments for instructional purposes, the present invention is not limited thereto. Accordingly, various modifications, adaptations, and combinations of various features of the described embodiments can be practiced without departing from the scope of the invention as set forth in the claims.

What is claimed is:

1. An integrated circuit comprising:
an oscillator that generates a clock signal having a clock frequency;
a first switching power converter that receives an input voltage Vin, outputs an output voltage Vout and includes a phase locked loop circuit and a comparator hysteresis generator, wherein the comparator hysteresis generator receives a filter voltage from the phase locked loop circuit and outputs a hysteresis voltage whose magnitude deviates from 1−Vout/Vin based on the filter voltage, wherein the first switching power converter switches at a first frequency, and wherein the phase locked loop circuit synchronizes the first frequency to a first integer multiple of the clock frequency; and
a second switching power converter that switches at a second frequency, wherein the second frequency is a second integer multiple of the clock frequency, and wherein the second integer multiple can equal the first integer multiple.

2. The integrated circuit of claim 1, wherein the integrated circuit is a tile-based power management unit, and wherein the first switching power converter and the second switching power converter are tiles of the tile-based power management unit.

3. The integrated circuit of claim 1, wherein the clock signal has a first edge, wherein the first switching power converter has a main switch with a gate that receives a gate signal, wherein the gate signal has a second edge, and wherein the first frequency is synchronized to the first integer multiple of the clock frequency when the second edge of the gate signal coincides with the first edge of the clock signal.

4. The integrated circuit of claim 1, wherein the first switching power converter includes an hysteretic feedback comparator, and wherein the hysteresis voltage is received by the hysteretic feedback comparator.

5. The integrated circuit of claim 4, wherein the first switching power converter is coupled through a resistor to an inductor, wherein the hysteretic feedback comparator receives a feedback voltage from the inductor, and wherein the hysteretic feedback comparator outputs a control signal based on the feedback voltage, the hysteresis voltage and a reference voltage.

6. An integrated circuit comprising:
an oscillator that generates a clock signal;
a first switching power converter that includes a first phase locked loop and a comparator hysteresis generator, wherein the comparator hysteresis generator receives a filter signal from the first phase locked loop, wherein the first phase locked loop synchronizes the first switching power converter to the clock signal, and wherein the first switching power converter does not include an oscillator that determines a switching frequency of the first switching power converter; and a second switching power converter that includes a second phase locked loop, wherein the second phase locked loop synchronizes the second switching power converter to the clock signal, and wherein the second switching power converter does not include an oscillator that determines a switching frequency of the second switching power converter.

7. The integrated circuit of claim 6, wherein the first switching power converter includes an hysteretic feedback comparator, and wherein the comparator hysteresis generator uses the filter signal to generate an hysteresis voltage that is received by the hysteretic feedback comparator.

8. The integrated circuit of claim 7, wherein the first switching power converter is coupled through a resistor to an inductor, wherein the hysteretic feedback comparator receives a feedback voltage from the inductor, and wherein the hysteretic feedback comparator outputs a control signal based on the feedback voltage, the hysteresis voltage and a reference voltage.

9. The integrated circuit of claim 6, wherein the integrated circuit is a tile-based power management unit, and wherein the first switching power converter and the second switching power converter are tiles of the tile-based power management unit.

10. The integrated circuit of claim 6, wherein the clock signal has a first edge, wherein the first switching power converter has a main switch with a gate that receives a gate signal, wherein the gate signal has a second edge, and wherein the first switching power converter is synchronized to the clock signal when the second edge of the gate signal coincides with the first edge of the clock signal.

11. The integrated circuit of claim 10, wherein the clock signal has a first frequency and the gate signal has a second frequency, and wherein the second frequency is an integer multiple of the first frequency.

12. The integrated circuit of claim 6, wherein the first switching power converter has a first main switch with a first gate that receives a first gate signal, wherein the second switching power converter has a second main switch with a second gate that receives a second gate signal, wherein the clock signal has a frequency F, wherein the first gate signal has a frequency n*F, wherein the second gate signal has a frequency m*F, wherein n and m are integer values between one and twenty, and wherein n and m can be the same integer value or different integer values.

13. A method comprising:
receiving an external clock signal onto a phase locked loop of a switching power converter integrated circuit, wherein the switching power converter integrated circuit receives an input voltage Vin and outputs an output voltage Vout;
receiving a gate signal onto the phase locked loop, wherein the gate signal is also received onto a gate of a main switch of the switching power converter integrated circuit;

generating a filter signal that is received by a comparator hysteresis generator, wherein the phase locked loop generates the filter signal; and
generating a hysteresis voltage using the filter signal, wherein the hysteresis voltage has a magnitude that deviates from 1−Vout/Vin based on the filter voltage.

14. The method of claim 13, wherein the external clock signal has a first edge, wherein the gate signal has a second edge, and wherein the gate signal is synchronized to the external clock signal when the second edge of the gate signal coincides with the first edge of the clock signal.

15. The method of claim 13, wherein the switching power converter integrated circuit does not include an oscillator that determines a switching frequency of the switching power converter integrated circuit.

16. The method of claim 13, further comprising:
receiving a second gate signal onto a second gate of a second main switch of the switching power converter integrated circuit, wherein the filter signal is used to synchronize the second gate signal to the external clock signal.

17. The method of claim 16, wherein the external clock signal has a frequency F, wherein the gate signal has a frequency n*F, wherein the second gate signal has a frequency m*F, wherein n and m are integer values between one and ten, and wherein n and m can be the same integer value or different integer values.

18. An integrated circuit comprising:
an oscillator that generates a clock signal;
a first switching power converter that receives an input voltage Vin, outputs an output voltage Vout, and that comprises:
means for synchronizing the first switching power converter to the clock signal, wherein the means includes a charge pump and outputs an hysteresis voltage whose magnitude deviates from 1−Vout/Vin based on an output of the charge pump; and
a main switch with a gate that is coupled to the means; and
a second switching power converter that is synchronized to the clock signal.

19. The integrated circuit of claim 18, wherein the clock signal has a first edge, wherein a gate signal is present on the gate, wherein the gate signal has a second edge, and wherein the means synchronizes the second edge of the gate signal to coincide with the first edge of the clock signal.

20. The integrated circuit of claim 18, wherein the clock signal has a rising edge, wherein a gate signal is present on the gate, wherein the main switch turns on at a falling edge of the gate signal, and wherein the means synchronizes the falling edge of the gate signal to coincide with the rising edge of the clock signal.

21. The integrated circuit of claim 18, wherein neither the first switching power converter nor the second switching power converter includes an oscillator that determines a switching frequency of a power converter.

* * * * *